United States Patent
Aoki

(10) Patent No.: US 6,943,584 B2
(45) Date of Patent: Sep. 13, 2005

(54) PROGRAMMABLE SEMICONDUCTOR DEVICE INCLUDING UNIVERSAL LOGIC MODULES COPING WITH AS MANY USER INVERTERS

(75) Inventor: Tomonari Aoki, Kanagawa (JP)

(73) Assignee: NEC Electronics Corporation, Kawasaki (JP)

(*) Notice: Subject to any disclaimer, the term of this patent is extended or adjusted under 35 U.S.C. 154(b) by 72 days.

(21) Appl. No.: 10/636,636

(22) Filed: Aug. 8, 2003

(65) Prior Publication Data

US 2004/0056688 A1 Mar. 25, 2004

(30) Foreign Application Priority Data

Sep. 20, 2002 (JP) .......................................... 2002-275376

(51) Int. Cl.[7] ............................................ H03K 19/173
(52) U.S. Cl. .............................. 326/47; 326/37; 326/101
(58) Field of Search ............................. 326/37, 38, 47, 326/49–50, 101–103

(56) References Cited

U.S. PATENT DOCUMENTS 6,674,307 B2 * 1/2004 Mizuno ....................... 326/113

FOREIGN PATENT DOCUMENTS

JP            2002-198801            7/2002

* cited by examiner

*Primary Examiner*—Anh Q. Tran
(74) *Attorney, Agent, or Firm*—McGinn & Gibb, PLLC

(57) ABSTRACT

A universal logic module of a programmable semiconductor device is constructed by first, second, third, fourth and fifth terminals, a first transfer gate connected between the first and fourth terminals, a second transfer gate connected between the second and fourth terminals, and an inverter connected between the third and fifth terminals. The first and second transfer gates are controlled by voltages at the third and fifth terminals, so that one of the first and second transfer gates is turned ON and the other of the first and second transfer gates is turned OFF.

18 Claims, 13 Drawing Sheets

N.C.="non-connection"

N.C.="non-connection"

N.C.="non-connection"

N.C.="non-connection"

N.C.="non-connection"

N.C.="non-connection"

N.C.="non-connection"

N.C.="non-connection"

N.C.="non-connection"

N.C.="non-connection"

N.C.="non-connection"

N.C.="non-connection"

N.C.="non-connection"

N.C.="non-connection"

PROGRAMMABLE SEMICONDUCTOR DEVICE INCLUDING UNIVERSAL LOGIC MODULES COPING WITH AS MANY USER INVERTERS

BACKGROUND OF THE INVENTION

1. Field of the Invention

The present invention relates to a programmable semiconductor device including universal logic modules.

2. Description of the Related Art

In a programmable semiconductor device such as a field programmable gate array (FPGA) device, a logic cell formed by a plurality of kinds of universal logic modules is provided. Then, the user performs a connection operation upon the logic cell to realize a desired user logic circuit.

In a prior art programmable semiconductor device (see: JP-A-2002-198801), a logic cell is constructed by first universal logic modules serving as two-input, one-output multiplexers, second universal logic modules serving as inverters and a third universal logic module serving as a two-input, one-output multiplexer. Note that the third universal logic module has the same configuration as the universal logic modules except that an inverter having a large current driving ability is provided. Also, various kinds of user logic circuits can be made by the user using the first universal logic modules. This will be explained later in detail.

In order to cope with as many user inverters as possible in the logic cell of the above-described prior art programmable semiconductor device, the number of second universal logic modules may be increased. In this case, however, if the ratio of the first universal logic modules, the second universal logic modules and the third universal logic modules is inappropriate due to the increased number of the second universal logic modules, the number of unused logic modules may be increased, which would increase a wasted area of the logic cell.

Further, in the logic cell of the above-described prior art programmable semiconductor device, a user delay circuit can be realized by connecting a plurality of the second universal logic modules in series. In this case, however, long connections are required between the series of the second universal logic modules, so that a delay time of the user delay circuit is increased.

Still further, since all the second universal logic modules are of the same type, a realized user inverter has the same driving power and the same delay time. As a result, various kinds of user inverters cannot be realized.

SUMMARY OF THE INVENTION

It is an object of the present invention to provide a semiconductor device including a logic cell formed by universal logic modules capable of coping with as many user inverters as possible, providing a user delay circuit having a smaller delay time and providing a user inverter having various kinds of current driving abilities and various kinds of delay times.

According to the present invention, a logic module of a programmable semiconductor device is constructed by first, second, third, fourth and fifth terminals, a first transfer gate connected between the first and fourth terminals, a second transfer gate connected between the second and fourth terminals, and an inverter connected between the third and fifth terminals. The first and second transfer gates are controlled by voltages at the third and fifth terminals, so that one of the first and second transfer gates is turned ON and the other of the first and second transfer gates is turned OFF. Thus, a user inverter using the above-mentioned inverter can be realized without the first and second transfer gates.

Also, a logic module of a programmable semiconductor device is constructed by: first, second, third, fourth, fifth, sixth and seventh terminals; first and second connection/non-connection nodes capable of being either in a connection state or in a non-connection state; a first inverter connected between the first terminal and the first connection/non-connection terminal; a second inverter connected between the third terminal and the second connection/non-connection terminal; a third inverter connected between the fifth and seventh terminals; a first transfer gate connected between the first connection/non-connection node and the sixth terminal; and a second transfer gate connected between the second connection/non-connection node and the sixth terminal. The first and second transfer gates are controlled by voltages at the fifth and seventh terminals so that one of the first and second transfer gates is turned ON and the other of the first and second transfer gates is turned OFF. Thus, a user inverter using one of the first, second and third inverters can be realized without the first and second transfer gates.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiment, a prior art programmable semiconductor device will be explained with reference to FIG. 1 (see: JP-A-2002-198801).

Figure 1:
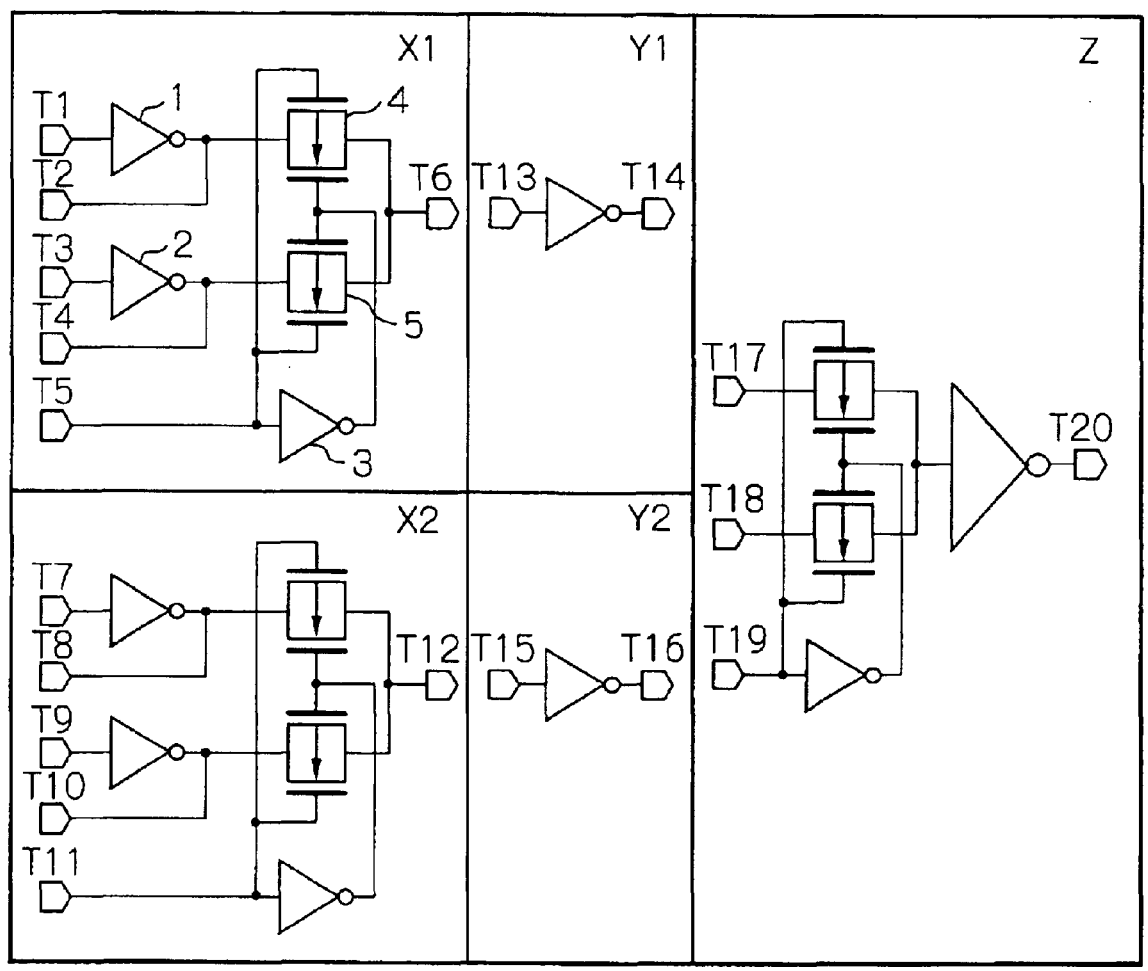
FIG. 1 is a circuit diagram illustrating a prior art programmable semiconductor device.

In FIG. 1, a logic cell is constructed by universal logic modules X1 and X2 serving as two-input, one-output multiplexers, universal logic modules Y1 and Y2 serving as inverters and a universal logic module Z serving as a two-input, one-output multiplexer. Note that the universal logic module Z has the same configuration as the universal logic modules X1 and X2 except that an inverter having a large current driving ability is provided.

The logic cell of FIG. 1 has twenty terminals T1 through T20. Therefore, the user performs a connection operation upon all or some of the terminals T1 through T20, thus completing a desired user logic circuit.

In more detail, the universal logic module X1 is constructed by three CMOS inverters 1, 2 and 3 and two transfer gates 4 and 5 each formed by a P-channel MOS transistor and an N-channel MOS transistor. The transfer gates 4 and 5 are controlled by a voltage at the terminal T5 and the output voltage of the inverter 3, so that one of the transfer gates 4 and 5 is turned ON and the other is turned OFF.

Various kinds of user logic circuits can be made by the user using the universal logic module X1 as illustrated in FIGS. 2A, 2B, 2C and 2D.

Figure 2A:
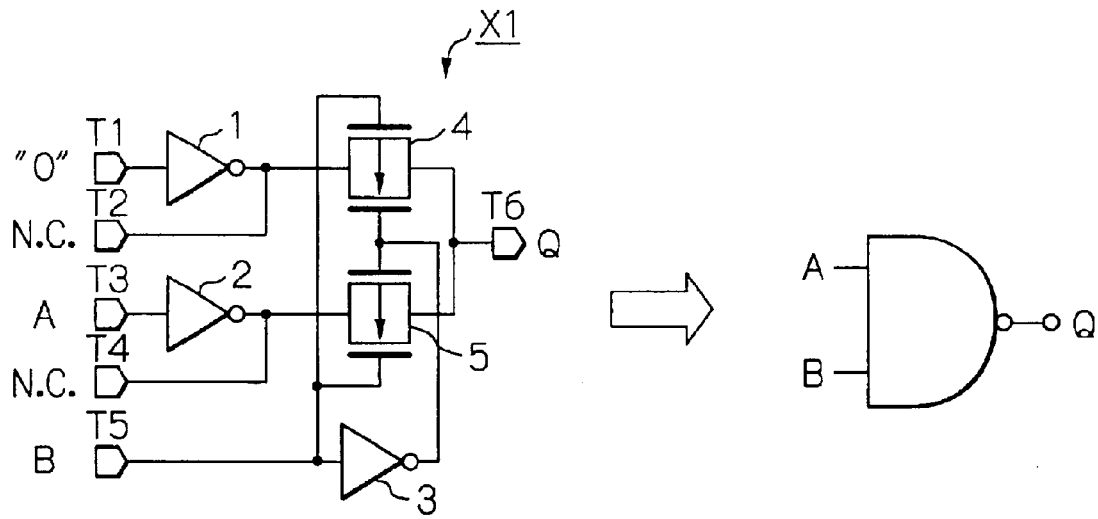
FIGS. 2A, 2B, 2C and 2D are circuit diagrams illustrating user logic circuits realized by the universal logic module of FIG. 1.

In FIG. 2A, the terminal T1 is fixed at "0" (low level), and the terminals T2 and T4 are open. Also, input signals A and B are supplied to the terminals T3 and T5, respectively, and an output signal Q is obtained from the terminal T6. Thus, a NAND circuit is realized.

Figure 2B:
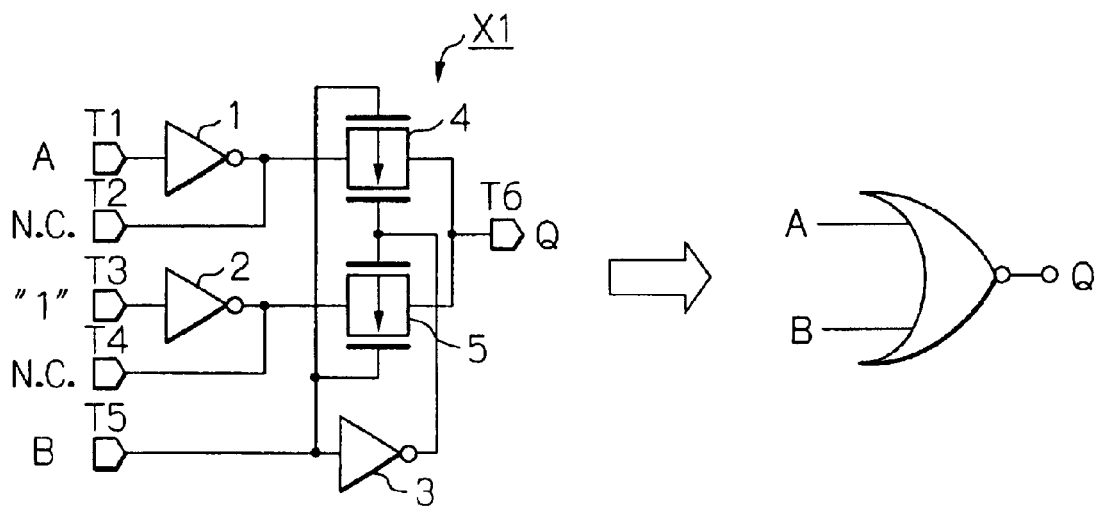

In FIG. 2B, the terminal T3 is fixed at "1" (high level), and the terminal T2 and T4 are open. Also, input signals A and B are supplied to the terminals T1 and T5, respectively, and an output signal Q is obtained from the terminal T6. Thus, a NOR circuit is realized.

Figure 2C:
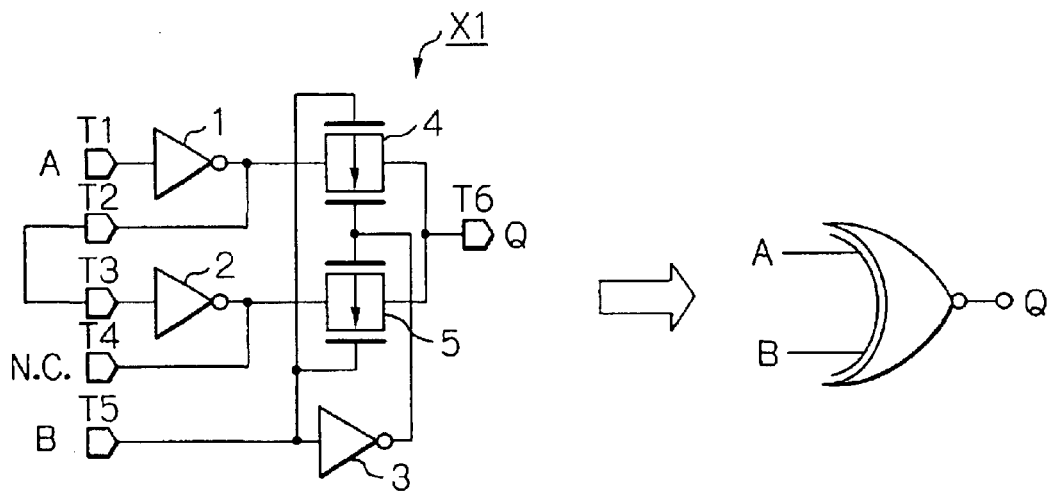

In FIG. 2C, the terminals T2 and T3 are short-circuited, and the terminal T4 is open.

Also, input signals A and B are supplied to the terminals T1 and T5, respectively, and an output signal Q is obtained from the terminal T6. Thus, an exclusive NOR circuit is realized.

Figure 2D:
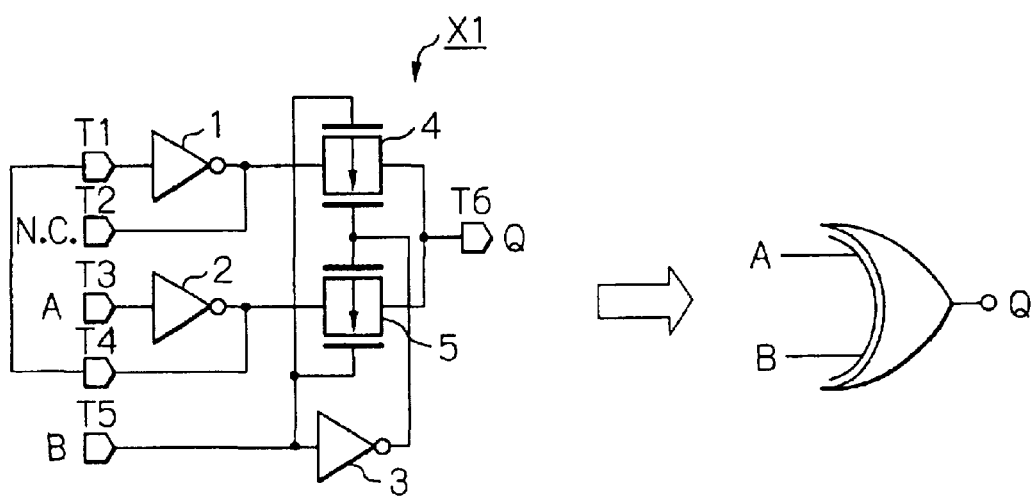

In FIG. 2D, the terminals T1 and T4 are short-circuited, and the terminal T2 is open. Also, input signals A and B are supplied to the terminals T3 and T5, respectively, and an output signal Q is obtained from the terminal T6. Thus, an exclusive OR circuit is realized.

Figure 3:
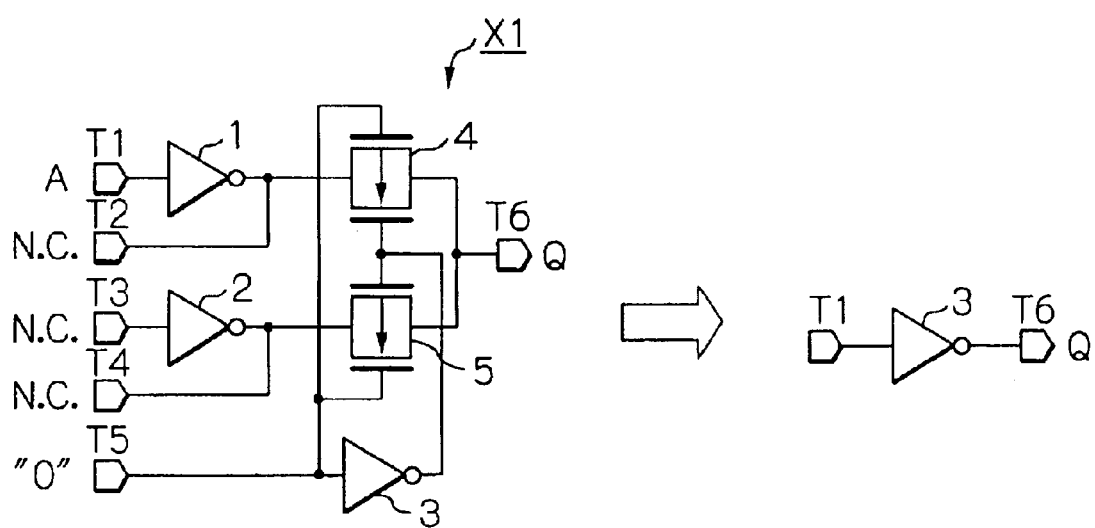
FIG. 3 is a circuit diagram illustrating a user inverter realized by the universal logic module of FIG. 1.

On the other hand, a user inverter may be realized by the user using the universal logic module X1 or X2. For example, in the universal logic module X1, as illustrated in FIG. 3, the terminal T5 is fixed at "0" (low level), and the terminals T2, T3 and T4 are open. Also, an input signal A is supplied to the terminal T1, and an output signal Q is obtained from the terminal T6. In this case, however, a large delay time is generated due to the presence of the transfer gate 4. Therefore, the universal logic modules Y1 and Y2 are provided in the logic cell of FIG. 1 specialized for forming user inverters.

Also, in order to cope with as many user inverters as possible in the logic cell of FIG. 1, the number of the universal logic modules such as Y1 and Y2 may be increased. In this case, however, if the ratio of universal logic modules such as X1 and X2, universal logic modules such as Y1 and Y2 and universal logic modules such Z is inappropriate due to the increased number of the universal logic modules such as Y1 and Y2, the number of unused logic modules may be increased, which would increase a wasted area of the logic cell.

Further, in the logic cell of FIG. 1, a user delay circuit can be realized by connecting a plurality of the universal logic modules such as Y1 and Y2 in series. In this case, however, long connections are required between the series of the universal logic modules such as Y1 and Y2, so that a delay time of the user delay circuit is increased.

Still further, since all the universal logic modules such as Y1 and Y2 for inverters are of the same type, a realized user inverter has the same driving power and the same delay time. As a result, various kinds of user inverters cannot be realized.

Figure 4:
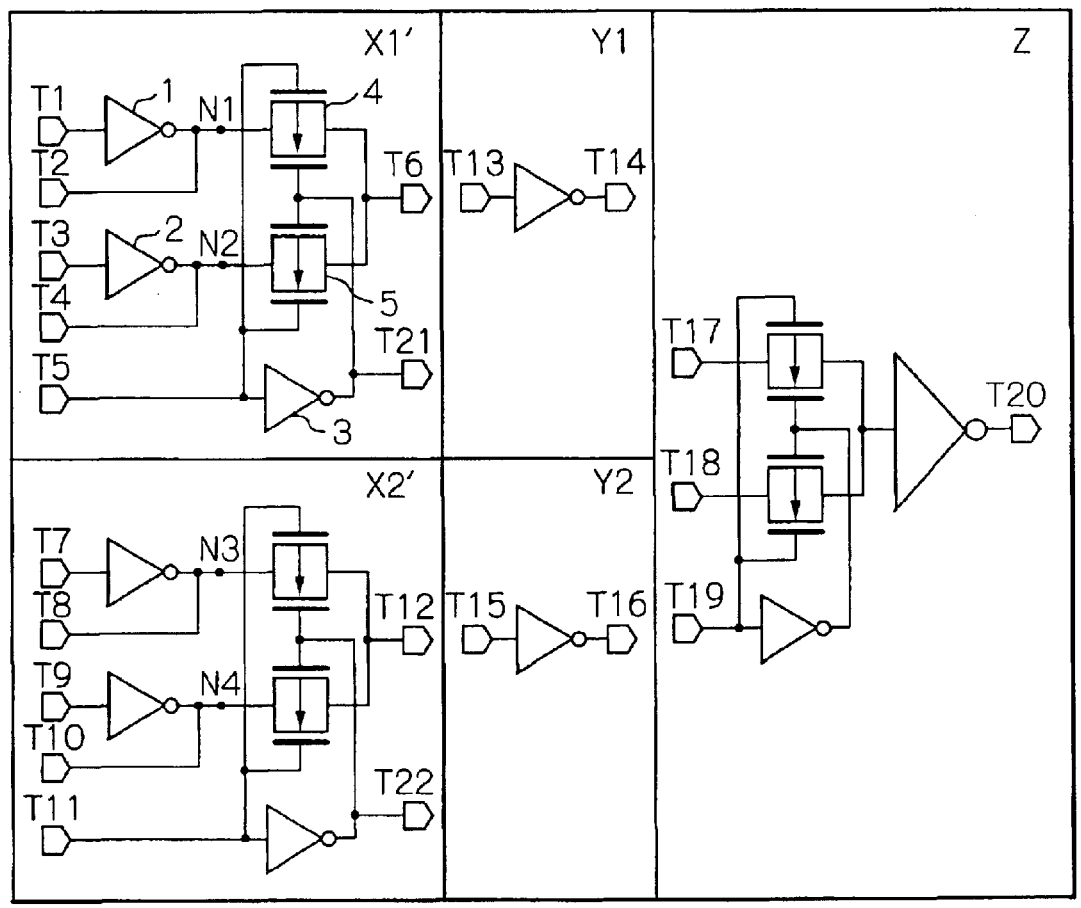
FIG. 4 is a circuit diagram illustrating an embodiment of the programmable semiconductor device according to the present invention.

In FIG. 4, which illustrates an embodiment of the programmable semiconductor device according to the present invention, the universal logic modules X1 and X2 of FIG. 1 are replaced by universal logic modules X1' and X2', respectively.

In the universal logic module X1' (X2'), a terminal T21 (T22) and connection/non-connection nodes N1 and N2 (N3 and N4) are added to the elements of the universal logic module X1 (X2) of FIG. 1.

The connection/non-connection node N1 will be explained next with reference to FIGS. 5A and 5B, which are partial cross-sectional views of the programmable semiconductor device of FIG. 4.

Figure 5A:
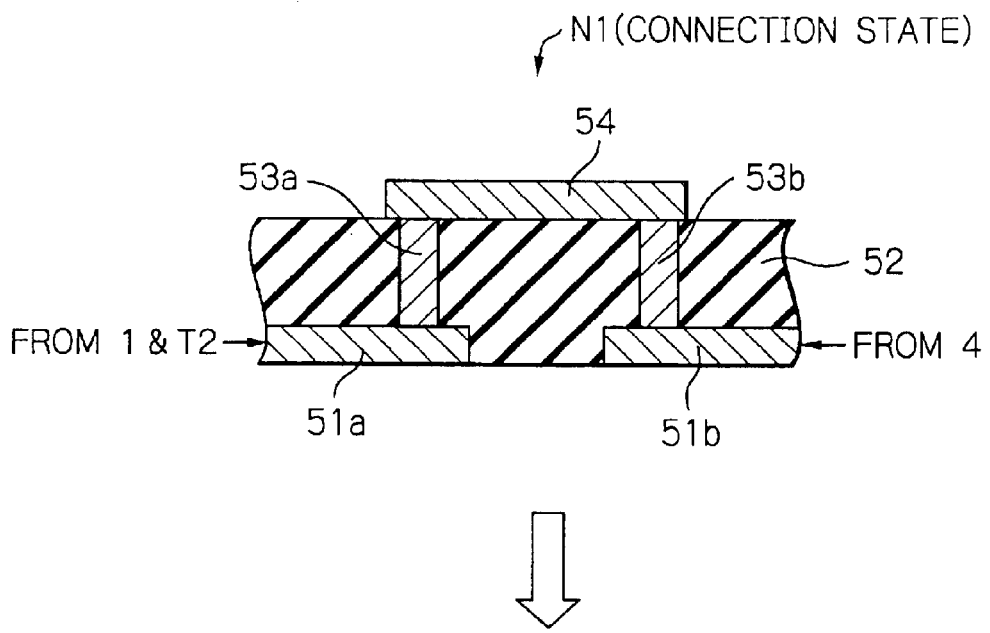
FIGS. 5A and 5B are cross-sectional views of the connection/non-connection node of FIG. 4.

In FIG. 5A, conductive layers 51a and 51b are connected to the inverter 1 (the terminal T2) and the transfer gate 4, respectively. Also, an insulating layer 52 is formed on the conductive layers 51a and 51b, and via structures 53a and 53b are formed through the insulating layer 52 on the conductive layers 51a and 51b, respectively. Further, a conductive layer 54 is formed on the via structures 53a and 53b, so that the conductive layer 51a is electrically connected to the conductive layer 51b, i.e., the node N1 is in a connection state.

Figure 5B:
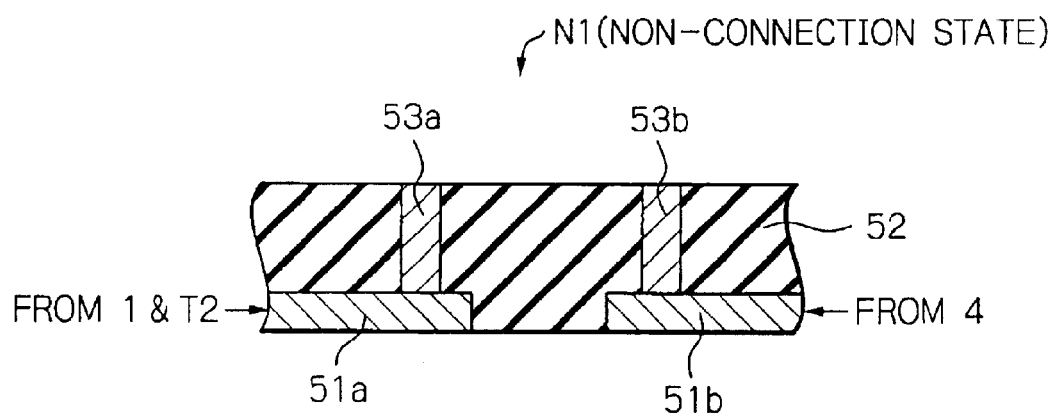

On the other hand, if an etching operation or a trimming operation is performed on the conductive layer 54, the entirety of the conductive layer 54 is removed as illustrated in FIG. 5B, so that the conductive layer 51a is electrically disconnected from the conductive layer 51b, i.e., the node N1 is in a non-connection state. In this case, note that a part of the conductive layer 54 can be removed.

Thus, the node N1 (N2, N3 and N4) can be either in a connection state or in a non-connection state.

The user logic circuits as illustrated in FIGS. 2A, 2B, 2C and 2D can be realized by the user using the universal logic module X1' under the condition that the nodes N1 and N2 are in a connection state and the terminal T21 is open, in the same way as in the universal logic module X1.

Also, various kinds of inverters and delay circuits can be made by the user using the universal logic module X1' as illustrated in FIGS. 6A, 6B, 6C, 7A, 7B, 7C, 8, 9, 10A, 10B, 10C, 11A, 11B and 11C.

Figure 6A:
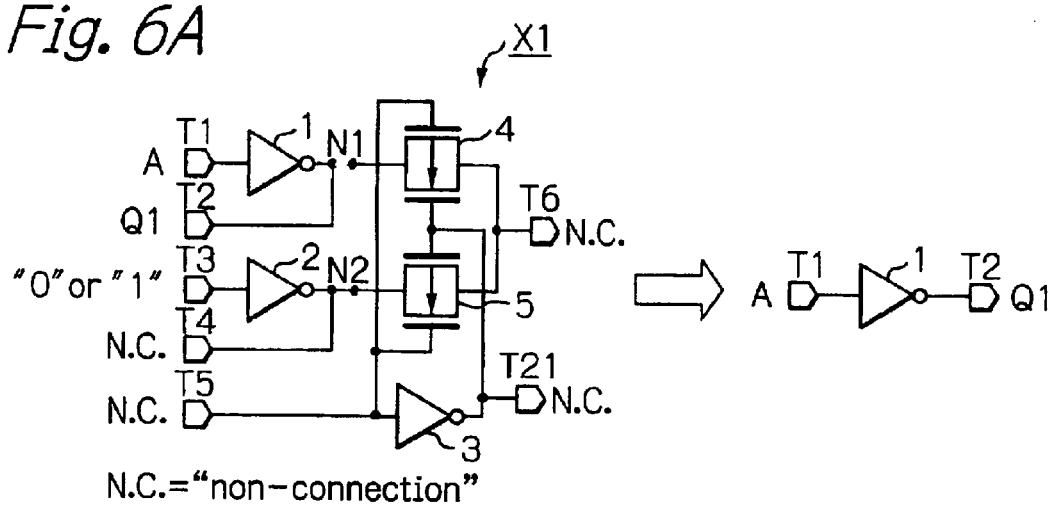
FIGS. 6A, 6B, 6C, 7A, 7B, 7C, 8, 9, 10A, 10B, 10C, 11A, 11B and 11C are circuit diagrams illustrating user logic circuits realized by the universal logic module of FIG. 4.
Figure 6B:
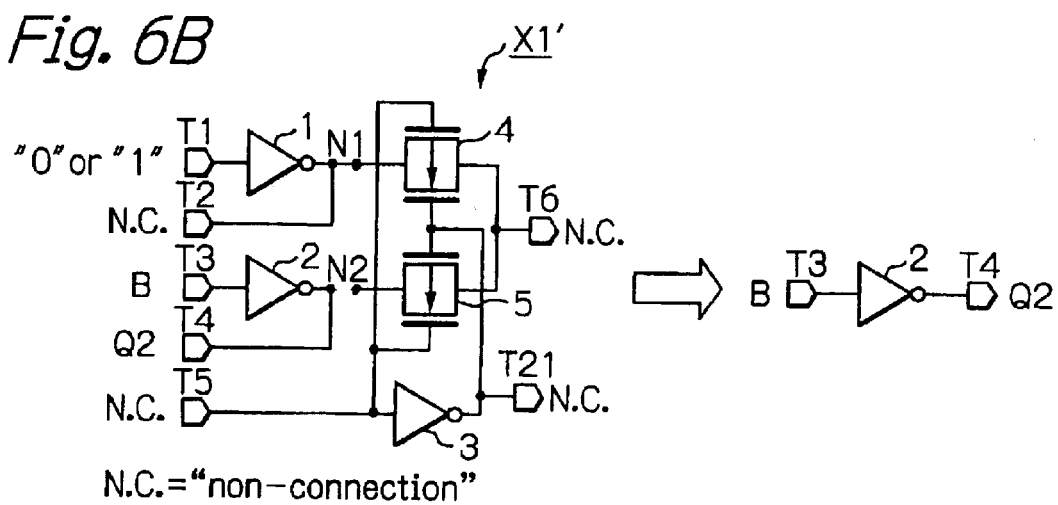
Figure 6C:
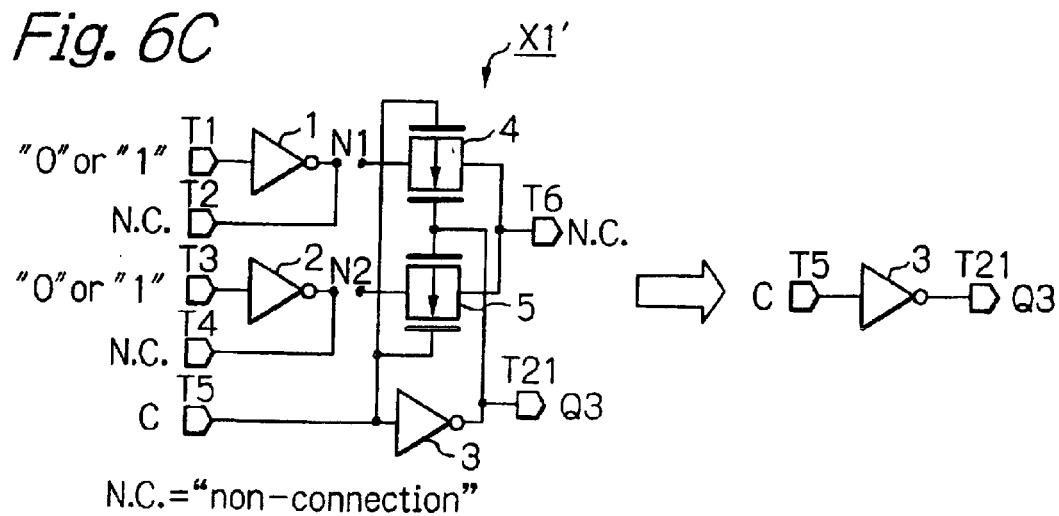

One inverter is realized by the universal logic module X1' as illustrated in FIGS. 6A, 6B and 6C.

In FIG. 6A, the terminal T3 is fixed at "0" (low level) or "1" (high level), and the terminals T4, T5, T6 and T21 are open. Also, an input signal A is supplied to the terminal T1, and an output signal Q1 is obtained from the terminal T2. Further, the node N1 is in a non-connection state, while the node N2 is in a connection state. Thus, one inverter using the inverter 1 is realized. In this case, since no transfer gate is present between the terminals T1 and T2, the realized inverter has a higher current driving ability and a smaller delay time as compared with an inverter realized by the universal logic module X1 of FIG. 1.

In FIG. 6B, the terminal T1 is fixed at "0" (low level) or "1" (high level), and the terminals T2, T5, T6 and T21 are open. Also, an input signal B is supplied to the terminal T3, and an output signal Q2 is obtained from the terminal T4. Further, the node N1 is in a connection state, while the node N2 is in a non-connection state. Thus, one inverter using the inverter 2 is realized. In this case, since no transfer gate is present between the terminals T3 and T4, the realized inverter has a higher current driving ability and a smaller delay time as compared with an inverter realized by the universal logic module X1 of FIG. 1.

In FIG. 6C, the terminals T1 and T3 are fixed at "0" (low level) or "1" (high level), and the terminals T2, T4, and T6 are open. Also, an input signal C is supplied to the terminal T5, and an output signal Q3 is obtained from the terminal T21. Further, the nodes N1 and N2 are in a non-connection state. Thus, one inverter using the inverter 3 is realized. In this case, since no transfer gate is present between the terminals T5 and T21, the realized inverter has a higher current driving ability and a smaller delay time as compared with an inverter realized by the universal logic module X1 of FIG. 1.

Figure 7A:
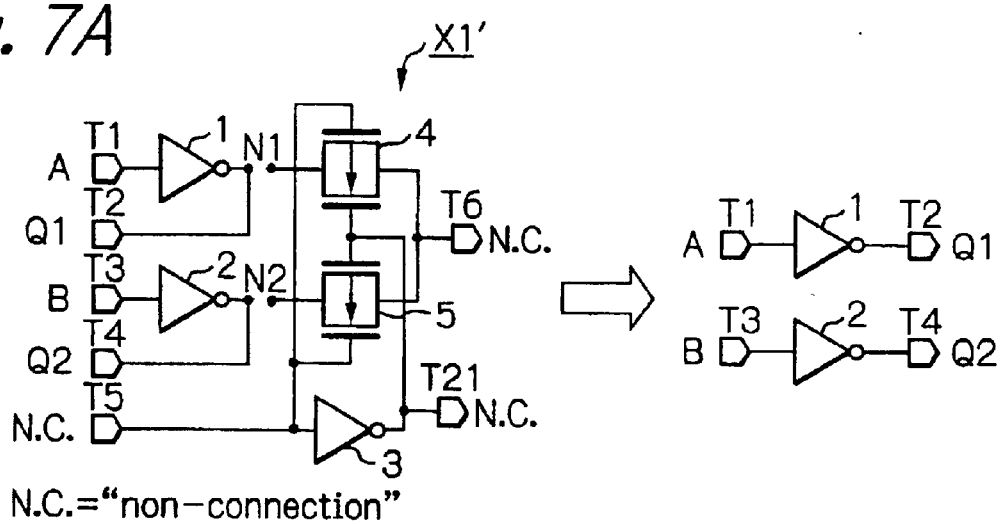
Figure 7B:
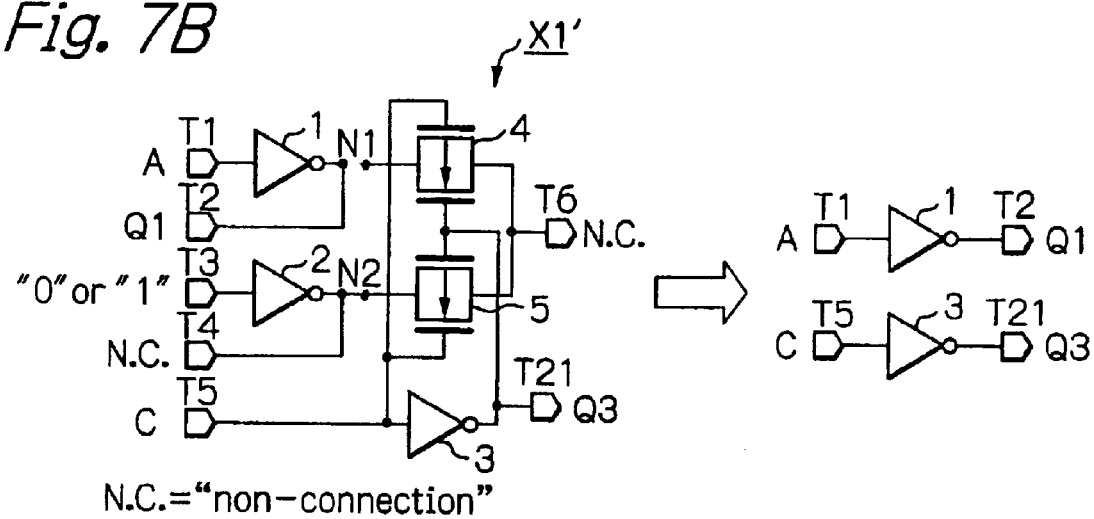
Figure 7C:
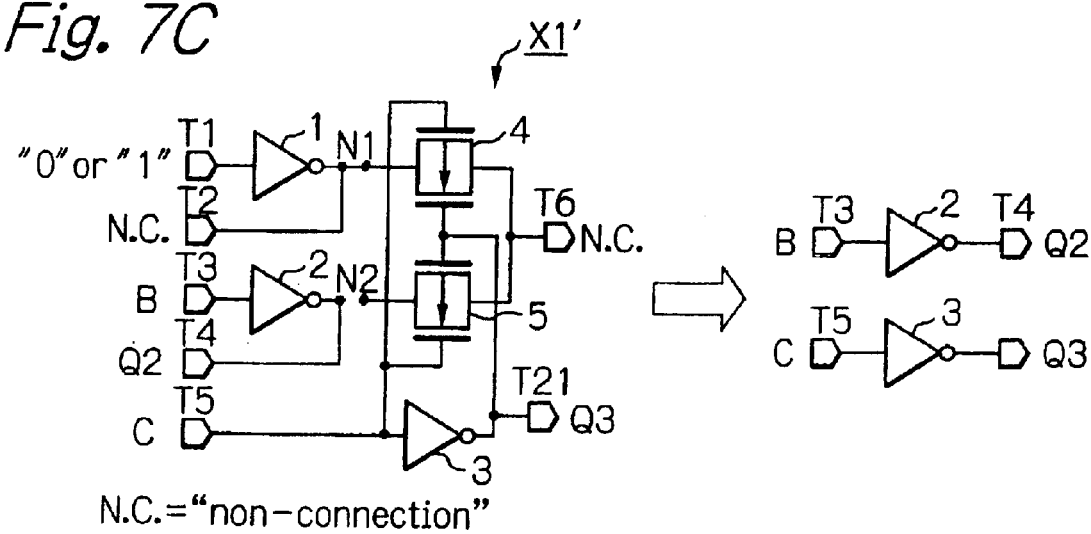

Two inverters are realized by the universal logic module X1' as illustrated in FIGS. 7A, 7B and 7C.

In FIG. 7A, the terminals T5, T6 and T21 are open. Also, input signals A and B are supplied to the terminals T1 and T3, respectively, and output signals Q1 and Q2 are obtained from the terminals T2 and T4, respectively. Further, the nodes N1 and N2 are in a non-connection state. Thus, two inverters using the inverters 1 and 2 are realized. In this case, since no transfer gate is present between the terminals T1 and T2 and between the terminals T3 and T4, each of the realized inverters has a higher current driving ability and a smaller delay time as compared with an inverter realized by the universal logic module X1 of FIG. 1.

In FIG. 7B, the terminal T3 is fixed at "0" (low level) or "1" (high level), and the terminals T4 and T6 are open. Also, input signals A and C are supplied to the terminals T1 and T5, respectively, and output signals Q1 and Q3 are obtained from the terminals T2 and T21, respectively. Further, the node N1 is in a non-connection state, while the node N2 is in a connection state. Thus, two inverters using the inverters 1 and 3 are realized. In this case, since no transfer gate is present between the terminals T1 and T2 and between the terminals T5 and T21, each of the realized inverters has a higher current driving ability and a smaller delay time as compared with an inverter realized by the universal logic module X1 of FIG. 1.

In FIG. 7C, the terminal T1 is fixed at "0" (low level) or "1" (high level), and the terminals T2 and T6 are open. Also, input signals B and C are supplied to the terminals T3 and T5, respectively, and output signals Q2 and Q3 are obtained from the terminals T4 and T21, respectively. Further, the node N1 is in a connection state, while the node N2 is in a non-connection state. Thus, two inverters using the inverters 2 and 3 are realized. In this case, since no transfer gate is present between the terminals T3 and T4 and between the terminals T5 and T21, each of the realized inverters has a higher current driving ability and a smaller delay time as compared with an inverter realized by the universal logic module X1 of FIG. 1.

In FIGS. 7A, 7B and 7C, since two inverters are provided in the universal logic module X1', the integration can be enhanced.

Figure 8:
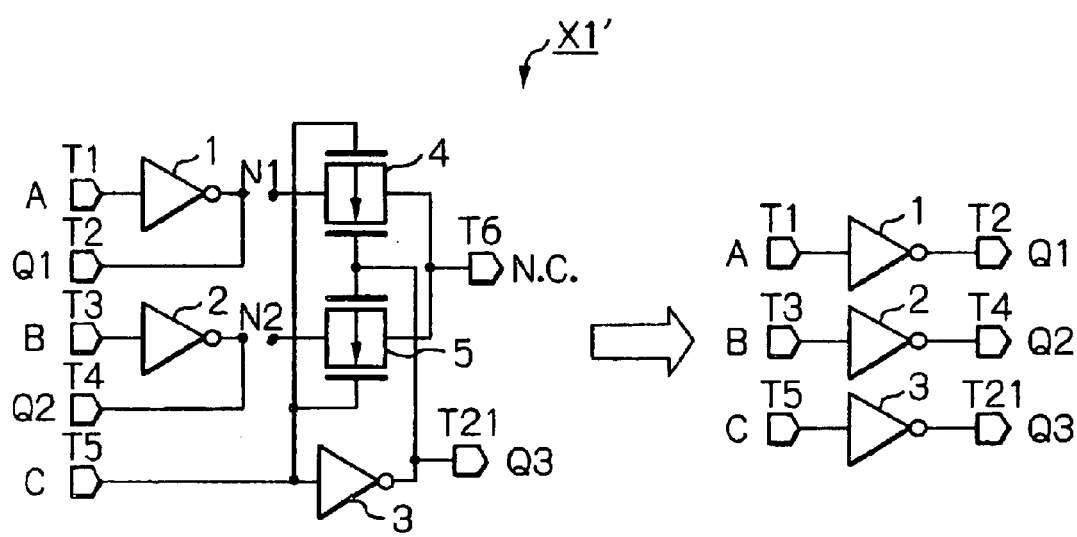

Three inverters are realized by the universal logic module X1' as illustrated in FIG. 8.

In FIG. 8, the terminal T6 is open. Also, input signals A, B and C are supplied to the terminals T1, T3 and T5, respectively, and output signals Q1, Q2 and Q3 are obtained from the terminals T2, T4 and T21, respectively. Further, the nodes N1 and N2 are in a non-connection state. Thus, three inverters using the inverters 1, 2 and 3 are realized. In this case, since no transfer gate is present between the terminals T1 and T2, between the terminals T3 and T4 and between the terminals T5 and T21, each of the realized inverters has a higher current driving ability and a smaller delay time as compared with an inverter realized by the universal logic module X1 of FIG. 1.

In FIG. 8, since three inverters are provided in the universal logic module X1', the integration can be enhanced.

Figure 9:
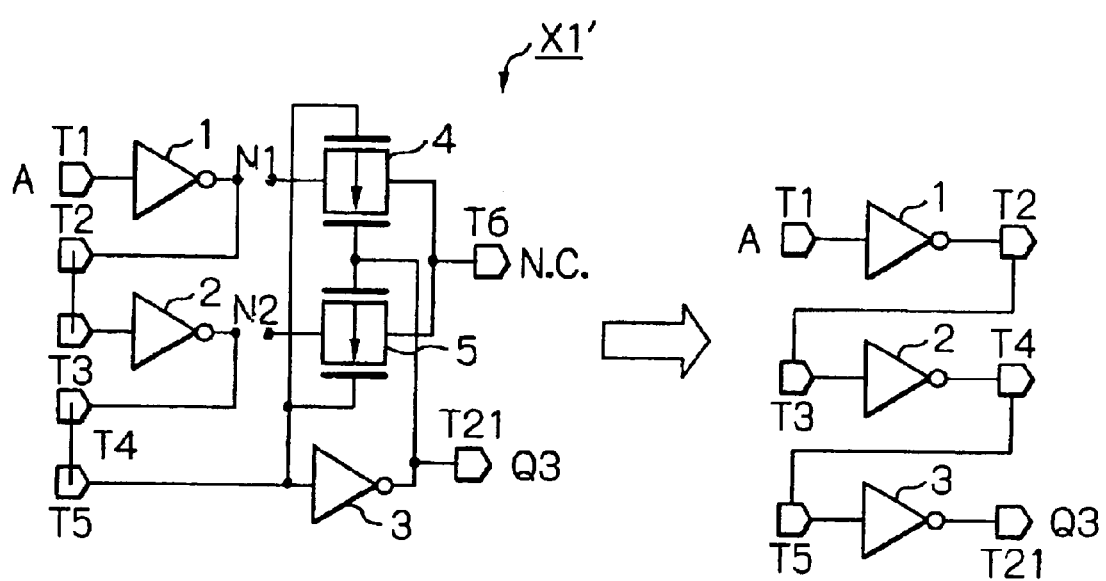

One inverter formed by three inverter elements is realized by the universal logic module X1' as illustrated in FIG. 9.

In FIG. 9, the terminal T2 is connected to the terminal T3, and the terminal T4 is connected to the terminal T5. Also, the terminal T6 is open. Also, an input signal A is supplied to the terminal T1, and an output signal Q3 is obtained from the terminal T21. Further, the nodes N1 and N2 are in a non-connection state. Thus, one inverter using the series of the inverters 1, 2 and 3 is realized. In this case, since no transfer gate is present between the terminals T1 and T21, the realized inverter has a higher current driving ability and a smaller delay time as compared with an inverter realized by the universal logic module X1 of FIG. 1.

Figure 10A:
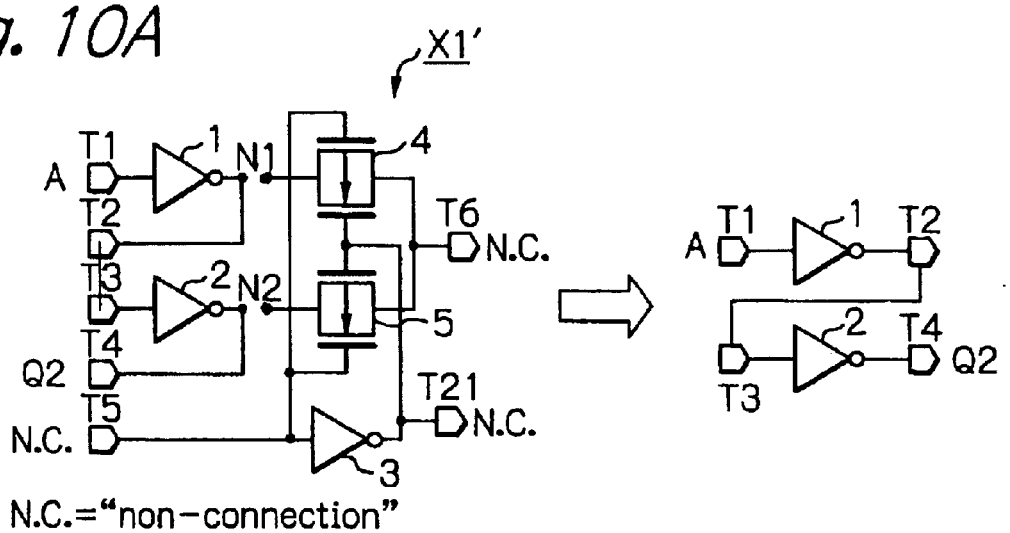
Figure 10B:
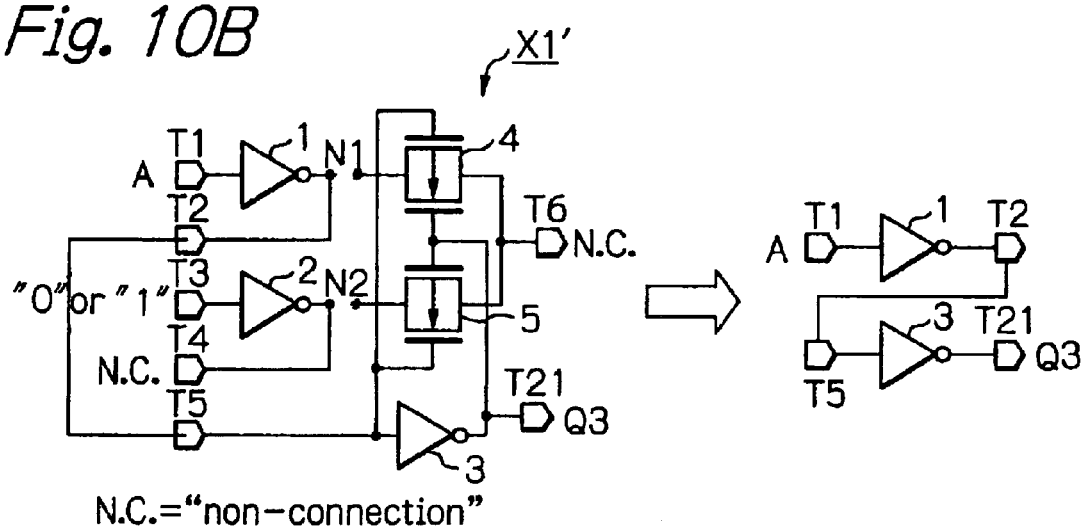
Figure 10C:
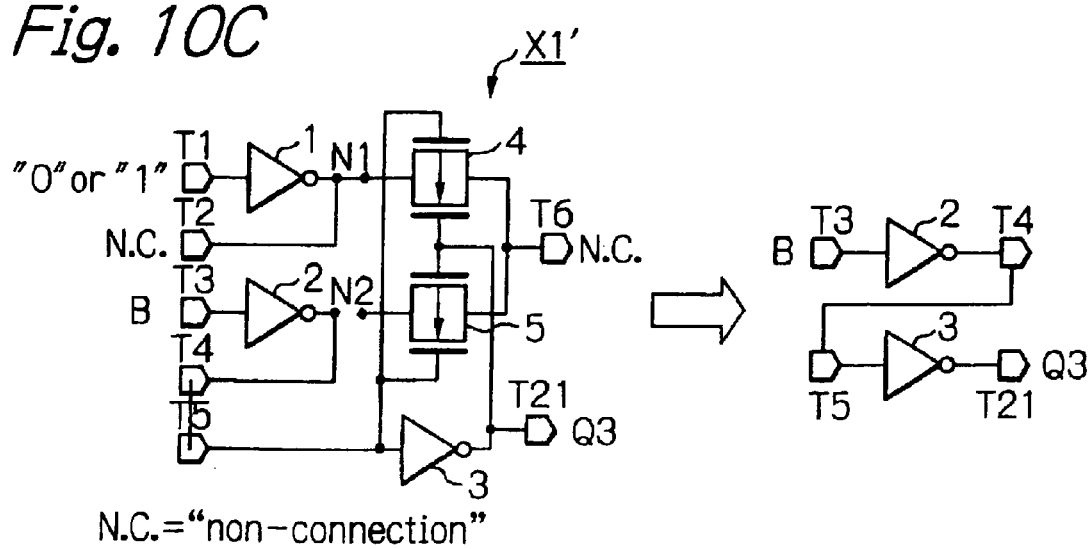

A delay circuit (buffer circuit) is realized by the universal logic module X1' as illustrated in FIGS. 10A, 10B and 10C.

In FIG. 10A, the terminal T2 is connected to the terminal T3, and the terminals T5, T6 and T21 are open. Also, an input signal A is supplied to the terminal T1, and an output signal Q2 is obtained from the terminal T4. Further, the nodes N1 and N2 are in a non-connection state. Thus, a delay circuit using the inverters 1 and 2 is realized. In this case, since no transfer gate is present between the terminals T1 and T4, the realized delay circuit has a high current driving ability.

In FIG. 10B, the terminal T2 is connected to the terminal T5. Also, the terminal T3 is fixed at "0" (low level) or "1" (high level), and the terminals T4 and T6 are open. Also, an input signal A is supplied to the terminal T1, and an output signal Q3 is obtained from the terminal T21. Further, the node N1 is in a non-connection state, while the node N2 is in a connection state. Thus, a delay circuit using the inverters 1 and 3 is realized. In this case, since no transfer gate is present between the terminals T1 and T3, the realized delay circuit has a high current driving ability.

In FIG. 10C, the terminal T4 is connected to the terminal T5. The terminal T1 is fixed at "0" (low level) or "1" (high level), and the terminals T2 and T6 are open. Also, an input signal B is supplied to the terminal T3, and an output signal Q3 is obtained from the terminal T21. Further, the node N1 is in a connection state, while the node N2 is in a non-connection state. Thus, a delay circuit using the inverters 2 and 3 is realized. In this case, since no transfer gate is present between the terminals T3 and T21, the realized delay circuit has a high current driving ability.

A delay circuit (buffer circuit) as well as an inverter are realized by the universal logic module X1' as illustrated in FIGS. 10A, 10B and 10C.

Figure 11A:
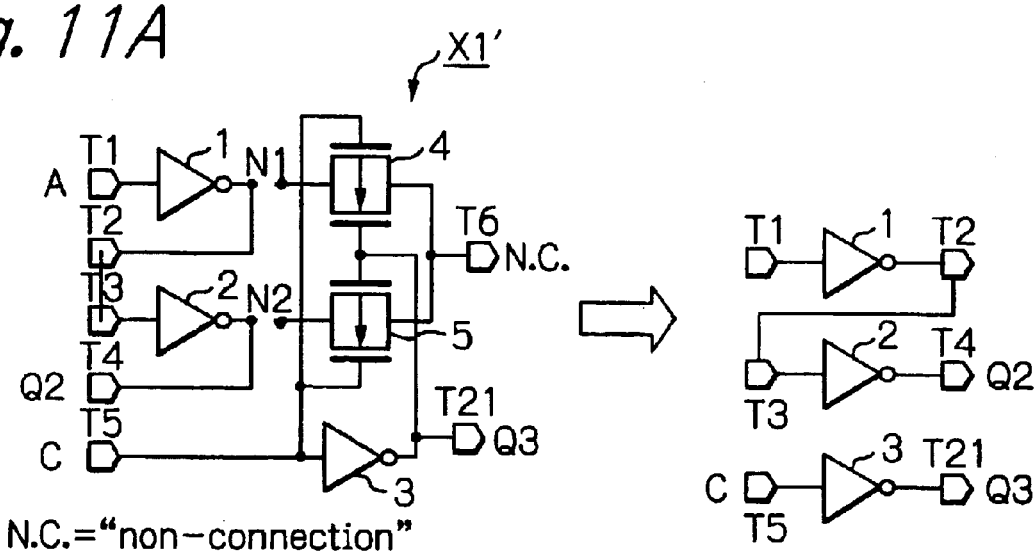

In FIG. 11A, the terminal T2 is connected to the terminal T3, and the terminals T6 and T21 are open. Also, input signals A and C are supplied to the terminals T1 and T5, respectively, and output signals Q2 and Q3 are obtained from the terminals T4 and T21, respectively. Further, the nodes N1 and N2 are in a non-connection state. Thus, a delay circuit using the inverters 1 and 2 and an inverter using the inverter 3 are realized. In this case, since no transfer gate is present between the terminals T1 and T4 and between the terminals T5 and T21, each of the realized delay circuit and inverter has a high current driving ability.

Figure 11B:
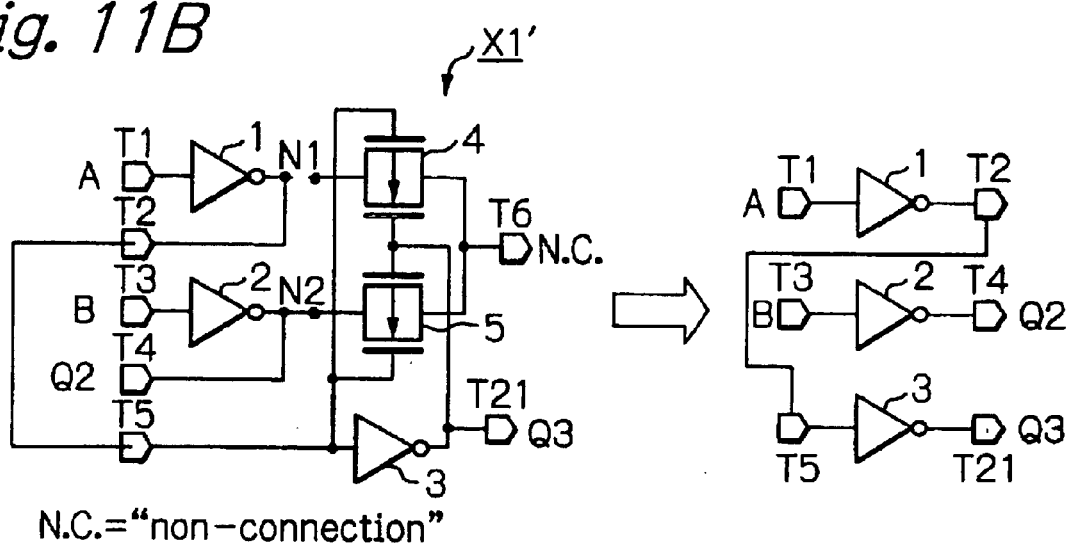

In FIG. 11B, the terminal T2 is connected to the terminal T5. Also, the terminal T6 is open. Also, input signals A and B are supplied to the terminals T1 and T3, respectively, and output signals Q2 and Q3 are obtained from the terminals T4 and T21, respectively. Further, the node N1 is in a non-connection state, while the node N2 is in a connection state.

Thus, a delay circuit using the inverters 1 and 3 and an inverter using the inverter 2 are realized. In this case, since no transfer gate is present between the terminals T1 and T2 and between the terminals T3 and T4, each of the realized delay circuit and inverter has a high current driving ability.

Figure 11C:
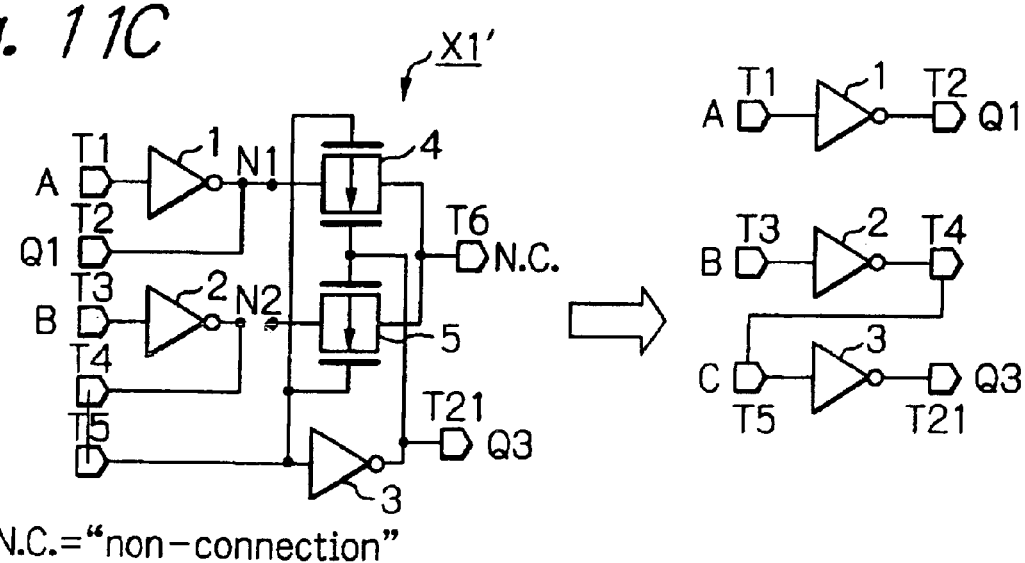

In FIG. 11C, the terminal T4 is connected to the terminal T5. The terminal T6 is open. Also, input signals A and B are supplied to the terminals T1 and T3, respectively, and output signals Q1 and Q3 are obtained from the terminals T2 and T21, respectively. Further, the node N1 is in a connection state, while the node N2 is in a non-connection state. Thus, a delay circuit using the inverters 2 and 3 and an inverter using the inverter 1 are realized. In this case, since no transfer gate is present between the terminals T3 and T21 and between the terminal T1 and T2, each of the realized delay circuit and inverter has a high current driving ability.

In the above-described embodiment, if the inverters 1, 2 and 3 have different current driving abilities and different delay times from each other, a realized user inverter can have various current driving abilities and delay times.

Figure 12A:
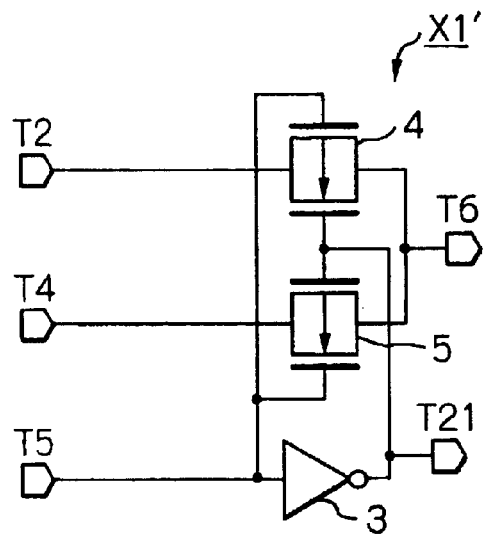
FIGS. 12A, 12B, 12C and 12D are circuit diagrams illustrating modifications of the universal logic module of FIG. 4.
Figure 12B:
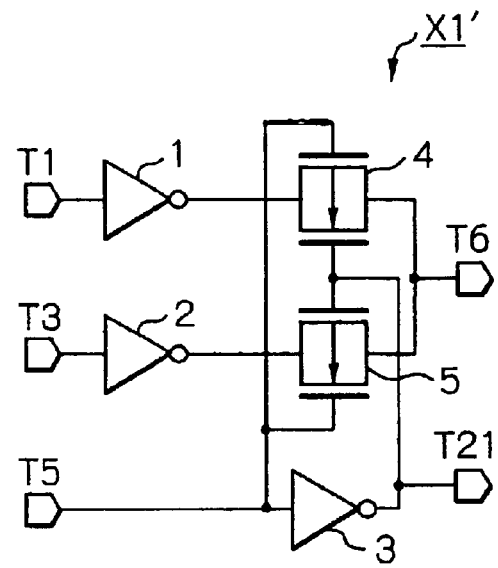
Figure 12C:
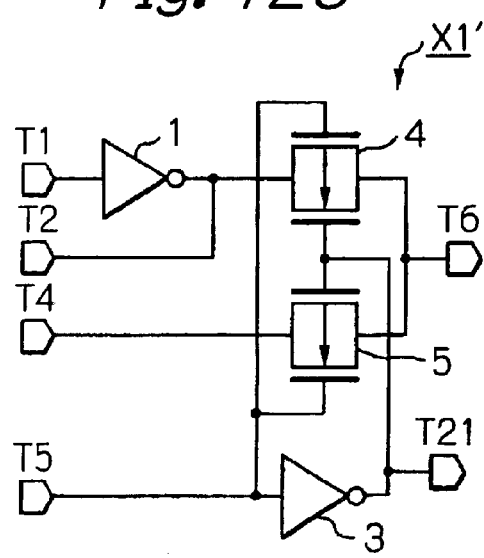
Figure 12D:
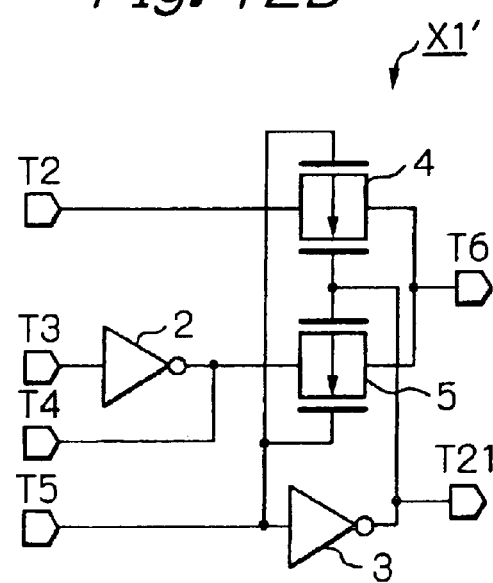

The present invention can be applied to a universal logic module as illustrated in FIGS. 12A, 12B, 12C and 12D. In FIG. 12A, the inverters 1 and 2, the terminals T1 and T3 and the nodes N1 and N2 are removed from the universal logic moduie X1' of FIG. 4. In FIG. 12B, the terminals T2 and T4 and the nodes N1 and N2 are removed from the universal logic module X1' of FIG. 4. In FIG. 12C, the inverter 2, the and terminal T3 and the nodes N1 and N2 are removed from the universal logic module X1' of FIG. 4. In FIG. 12D, the inverter 1, the terminal T1 and the nodes N1 and N2 are removed from the universal logic module X1' of FIG. 4. That is, in FIGS. 12A, 12B, 12C and 12D, at least one user inverter using the inverter 3 can be realized.

As explained hereinabove, according to the present invention, many user inverters and delay circuits having different current driving abilities and delay times can be provided.

What is claimed is:

1. A programmable semiconductor device including a universal logic module, said universal logic module comprising:
   first, second, third, fourth, fifth, and sixth terminals;
   a first transfer gate connected between said first and fourth terminals;
   a second transfer gate connected between said second and fourth terminals; and
   a first inverter connected between said third and fifth terminals,
   a second inverter connected between said first terminal and said sixth terminals,
   said first and second transfer gates being controlled by voltages at said third and fifth terminals, so that one of said first and second transfer gates is turned ON and the other of said first and second transfer gates is turned OFF,
   wherein a current driving ability of said first inverter is different from a current driving, ability of said second inverter.

2. The programmable semiconductor device as set forth in claim 1, further comprising:
   a seventh terminal;
   a third inverter connected between said second terminal and said seventh terminal,
   wherein current driving abilities of said first, second and third inverters are different from each other.

3. A programmable semiconductor device including a universal logic module, said universal logic module comprising:
   first, second, third, fourth, fifth, sixth, and seventh terminals;
   a first inverter connected between said third and fifth terminals;
   a second inverter connected between said first and sixth terminals;
   a third inverter connected between said second and seventh terminals;
   a first transfer gate connected between said fourth terminal and a first connection/non-connection node, said first connection/non-connection node connected between said sixth terminal and said first transfer gate; and
   a second transfer gate connected between said fourth terminal and a second connection/non-connection node, said second connection/non-connection node connected between said seventh terminal and said second transfer gate, each of said connection/non-connection nodes being able to be either in a connection state or in a non-connection state, said first and second transfer gates being controlled by voltages at said third and fifth terminals, so that one of said first and second transfer gates is turned ON and the other of said first and second transfer gates is turned OFF.

4. The programmable semiconductor device as set forth in claim 3, wherein a user inverter having said third and fifth terminals as an input and an output, respectively, is realized by using said first inverter.

5. The programmable semiconductor device as set forth claim 3, wherein said first connection/non-connection node is in a non-connection state, so that a user inverter having said first and sixth terminals as an input and an output, respectively, is realized by using said second inverter.

6. The programmable semiconductor device as set forth in claim 3, wherein said second connection/non-connection node is in a non-connection state, so that a user inverter having said second and seventh terminals as an input and an output, respectively, is realized by using said third inverter.

7. The programmable semiconductor device as set forth in claim 3, wherein said sixth and seventh terminals are connected to said second and third terminals, respectively, and said first and second connection/non-connection nodes are in a non-connection state, so that a user inverter having said first and fifth terminals as an input and an output, respectively, is realized by using said second, third and first inverters.

8. The programmable semiconductor device as set forth in claim 3, wherein said sixth terminal is connected to said second terminal, and said first and second connection/non-connection nodes are in a non-connection state, so that a user delay circuit having said first and seventh terminals as an input and an output, respectively, is realized by using said second and third inverters.

9. The programmable semiconductor device as set forth in claim 3, wherein said sixth terminal is connected to said third terminal, and said first connection/non-connection node is in a non-connection state, so that a user delay circuit having said first and fifth terminals as an input and an output, respectively, is realized by using said second and first inverters.

10. The programmable semiconductor device as set forth in claim 3,where said seventh terminal is connected to said third terminal, and said second connection/non-connection node is in a non-connection state, so that a user delay circuit having said second and fifth terminals as an input and an output, respectively, is realized by using said third and first inverters.

11. A programmable semiconductor device including a universal logic module, said universal logic module comprising:
   first, second, third, fourth, fifth, sixth and seventh terminals;
   first and second connection/non-connection nodes each capable of being either in a connection state or in a non-connection state;
   a first inverter connected between said first terminal and said first connection/non-connection node;
   a second inverter connected between said third terminal and said second connection/non-connection node;
   a third inverter connected between said fifth and seventh terminals;
   a first transfer gate connected between said first connection/non-connection node and said sixth terminal; and
   a second transfer gate connected between said second connection/non-connection node and said sixth terminal,
   said first and second transfer gates being controlled by voltages at said fifth and seventh terminals so that one of said first and second transfer gates is turned ON and the other of said first and second transfer gates is turned OFF.

12. The programmable semiconductor device as set forth in claim 11, wherein said first connection node is in a non-connection state, so that a user inverter having said first and second terminals as an input and an output, respectively, is realized by using said first inverter.

13. The programmable semiconductor device as set forth in claim 11, wherein said second connection/non-connection node is in a non-connection state, so that a user inverter having said third and fourth terminals as an input and an output, respectively, is realized by using said second inverter.

14. The programmable semiconductor device as set forth in claim 11, wherein a user inverter having said fifth and seventh terminals as an input and an output, respectively, is realized by using said third inverter.

15. The programmable semiconductor device as set forth in claim 11, wherein said second and fourth terminals are connected to said third and fifth terminals, respectively, and said first and second connection/non-connection nodes are in a non-connection state, so that a user inverter having said first and seventh terminals as an input and an output, respectively, is realized by using said first, second and third inverters.

16. The programmable semiconductor device as set forth in claim 11, wherein said second terminal is connected to said third terminal, and said first and second connection/non-connection nodes are in a non-connection state, so that a user delay circuit having said first and fourth terminals as an input and an output, respectively, is realized by using said first and second inverters.

17. The programmable semiconductor device as set forth in claim 11, wherein said second terminal is connected to said fifth terminal, and said first connection/non-connection node is in a non-connection state, so that a user delay circuit having said first and seventh terminals as an input and an output, respectively, is realized by using said first and third inverters.

18. The programmable semiconductor device as set forth in claim 11, wherein said fourth terminal is connected to said fifth terminal, and said second connection/non-connection node is in a non-connection state, so that a user delay circuit having said third and seventh terminals as an input and an output, respectively, is realized by using said second and third inverters.

* * * * *